United States Patent [19]

Eisenbart et al.

[11] Patent Number: 5,072,141

[45] Date of Patent: Dec. 10, 1991

[54] HIGH SPEED HIGH POWER H-BRIDGE SWITCH FOR INDUCTIVE LOADS

[75] Inventors: Gyula Eisenbart; John Geerligs, both of Calgary, Canada

[73] Assignee: Nova Husky Research Corporation, Calgary, Canada

[21] Appl. No.: 529,467

[22] Filed: May 29, 1990

[51] Int. Cl.$^5$ .............. H03K 17/687; H03K 3/01; H03K 17/60; H03K 17/74

[52] U.S. Cl. .............. 307/571; 307/270; 307/254; 307/257

[58] Field of Search .............. 307/571, 572, 254, 257, 307/270, 280, 300, 314, 443; 323/289, 290; 328/65, 113, 223

[56] References Cited

U.S. PATENT DOCUMENTS 4,540,899 9/1985 Pelly .............. 307/571

Primary Examiner—Stanley D. Miller
Assistant Examiner—Trong Phan
Attorney, Agent, or Firm—Stevens, Davis, Miller & Mosher

[57] ABSTRACT

A switch for an inductive load includes a first leg having a first field effect transistor connected between one terminal of the load to the high potential terminal of a power supply and a second leg having a second field effect transistor connected between the other terminal of the load and the low potential terminal of the power supply. A plurality of current paths located on opposite sides of the load terminals connected in parallel and extend from one of the load terminals to one of the power supply terminals. Each current path includes an inductor connected in series with a diode. A choke energy path is associated with each current path and includes a diode connected in series with a resistors. The inductors in the current paths operate to inhibit reverse recovery current through the diodes while the choke energy paths dissipate oscillation energy in the switch upon operation of the transistors to connect the inductive load across the terminals of the power supply.

14 Claims, 2 Drawing Sheets

HIGH SPEED HIGH POWER H-BRIDGE SWITCH FOR INDUCTIVE LOADS

The present invention relates to switches and in particular to a switch for use with an inductive load.

High speed switches for use with inductive loads such as magnetic bearings are known in the art. Traditionally, these conventional switches have had a limited upper switching rate of 17 KHz and have required an expensive chilled liquid cooling system. To overcome the cost problems associated with liquid cooling systems, an air cooled switch has been developed. However, these air cooled switches also suffer from the limited upper switching rate. Although these conventional switches are suitable in some applications, a higher switching rate is often desired or required in many applications such as for use with high speed compressors.

It is therefore an object of the present invention to provide a novel switch for use with an inductive load which obviates or mitigates the disadvantages associated with prior art devices.

According to one aspect of the present invention, there is provided a switch for an inductive load comprising:

a first semiconductor switch means for connection to one terminal of an inductive load and a second semiconductor switch means for connection to the opposite terminal of said load, said first and second switch means and load forming a series circuit with said first and second switch means being operable to connect and disconnect said one and opposite terminals of said load to high potential and low potential terminals of a power supply;

a current path including a first rectifying element extending from said opposite terminal to said high potential terminal and a second rectifying element extending from said one terminal to said low potential terminal; and means associated with said current path for inhibiting reverse recovery current through said rectifying elements and for dissipating energy in said switch due to said reverse recovery current upon operation of said first and second semiconductor switch means to connect said load to said power supply.

Preferably, the means to inhibit reverse recovery currents is in the form of an inductive element connected in series with the first and second rectifying elements and that the means to dissipate energy is in the form of a choke energy path in communication with the current path.

Preferably, the current path includes a plurality of first and second rectifying elements, each of which is connected between the respective terminals in parallel. It is also preferred that the choke energy path includes a third rectifying element and a resistive element connected in series.

Preferably, the semiconductor switches are field effect transistors, and therefore in operation the inductors inhibit reverse recovery current peak through the diodes upon operation of the transistors to connect the load to the power supply for a time period sufficient for the field effect transistors to turn fully on.

In still yet another aspect of the present invention there is provided an inductive circuit comprising:

a power supply having a positive terminal and a negative terminal;

an inductive load; and a switch operable to connect and disconnect said inductive load between said positive and negative terminals, said switch including a first semiconductor switch means connecting one terminal of said load to said positive terminal and a second semiconductor switch means connecting the other terminal of said load to said negative terminal;

a current path including a first rectifying element connected between said other and positive terminals and a second rectifying element connected between said one and negative terminals; and means associated with said current path for inhibiting reverse recovery current through said rectifying elements and for dissipating energy in said switch due to said reverse recovery current upon operation of said first and second semiconductor switch means to connect said load to said power supply, said reverse recovery currents being inhibited until said semiconductor switch means have reached a substantially fully on condition.

Preferably, the semiconductor switch means are operable at a switching rate of up to and in excess of 40 KHz and the inductive load is in the form of a magnetic bearing.

The present invention provides advantages in that due to the provision of the inductors in the parallel current paths, the peak reverse recovery currents through the diodes are reduced and delayed until the transistors are fully on. This operation reduces the effect of oscillations occurring due to stray inductance and capacitance in the switch on the gate of the transistor switches and reduces the overall oscillation energy in the switch. In addition, the resistor and diode in the choke energy paths function as resistive dampers to dissipate energy stored in the current path inductors and oscillation energy rapidly. Furthermore, since peak reverse recovery currents through the diodes in the current paths are reduced and delayed and since the resulting oscillation energy is conveniently dumped by the choke energy paths, power dissipation in the switch is reduced as compared with conventional switches. This allows the switching rate of the present switch which exceed conventional switches while still permitting the use of an air cooling system.

An embodiment of the present invention will now be described by way of example only with reference to the accompanying drawings in which.

Figure 1:
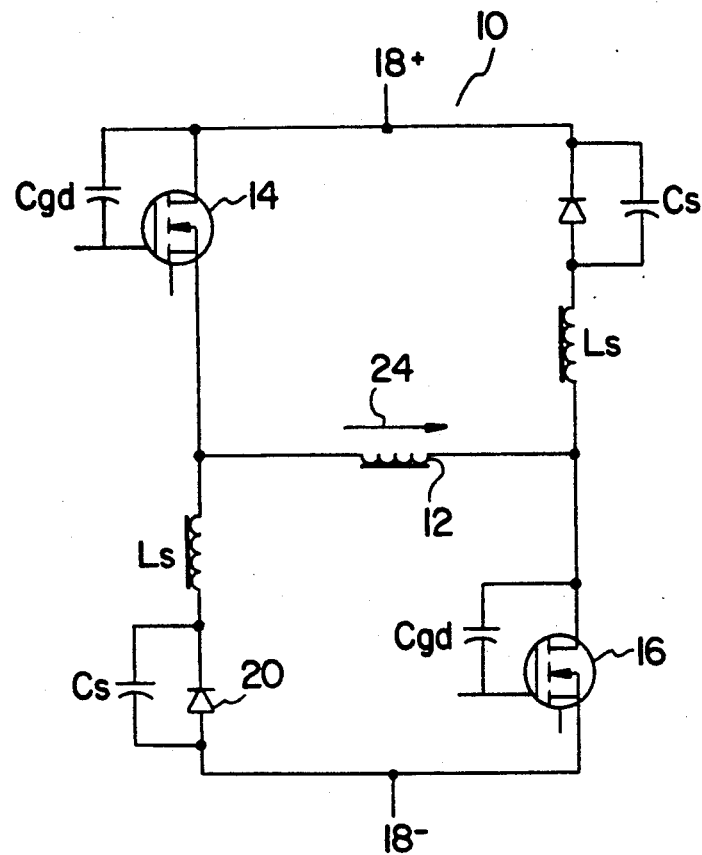
FIG. 1 is a schematic of a conventional prior art H-bridge switch.

Referring now to FIG. 1, a conventional prior art H-bridge switch 10 for use with an inductive load 12 is shown. For the sake of clarity, a brief description of the switch 10 and its operation will be described setting forth the limitations and problems associated with the conventional switch. As can be seen, the switch 10 includes a pair of field effect transistors (FETs) 14, 16 respectively located on opposite sides and connected in series with the inductive load 12. FET 14 has its drain terminal connected to the positive terminal 18 of a power supply 18 and its source terminal connected to one terminal of the inductive load 12. FET 16 has its drain terminal connected to the other terminal of the load and its source terminal connected to the negative terminal 18⁻ of the power supply 18. Thus, by supplying gating signals to the FETs 14, 16, the inductive load 12 can be connected across the terminals of the power supply 18 and energized.

To complete the H-bridge, a pair of diodes 20 and 22 are provided. Diode 20 has its anode connected to the negative terminal 18− and its cathode connected to the one terminal of the inductive load 12. Diode 22 has its anode connected to the other terminal of the inductive load 12 and its cathode connected to the positive terminal 18+ of the power supply 18. Inductor $L_s$ representing the stray inductance due to wiring and the lead inductance of the diodes 20, 22 are shown, each inductor $L_s$ being in series with one of the diodes. Capacitors $C_s$ representing the capacitance of the diodes 20, 22 respectively are also shown, each capacitor $C_s$ being in parallel with the diodes and in series with the stray inductance $L_s$. Thus, the stray inductance $L_s$ and the stray capacitance $C_s$ in each leg of the bridge switch 10 form a resonant circuit which rings at its natural frequency when energized.

In operation of the switch 10, gating signals are supplied to the FETs 14, 16 for a duration T/2 (this being equal to the switch duty cycle) by gate drivers (not shown) so that they conduct. This in turn connects the inductive load 12 between the terminals of the power supply 18. However, when the gating signals are applied to the FETs, the FETs 14, 16 go through a sequence of transitional steps before they reach their fully on condition as will be described below.

In particular, during application of the gating signals, the gate of the FETs 14, 16 charge and when the gate threshold is reached, the FETs begin to conduct current proportional to the gate charge. After the maximum available current is reached from the power supply, the drain to source voltage of each FET begins to fall at a rate primarily determined by the drain to gate capacitance (shown as $C_{gd}$ in FIG. 1) and the current capability of the gate driver. The apparent gate capacitance increases a the drain to source voltage approaches the gate to source voltage and the rate of drain voltage change decreases. The drain voltage thus falls to its final fully on value as determined by the load current and the static on-resistance of the FETs. As should be apparent, due to this operation, there is a time delay between the application of gating signals to the FETs 14, 16 and the achievement of the final fully on condition of the FETs 14, 16. In addition, during this sequence of steps, since a large current is associated with a high drain voltage, high power dissipation occurs in the FETs before the drain voltage reaches its final on value. As such it is desired to maximize the switching rate of the FETs to limit this power dissipation.

Once the FETs 14, 16 are fully on, a current I shown by arrow 24 flows through the load 12 and increases according to:

$$T/2 * E/L = delta\ I$$

wherein E is equal to the power supply voltage and L is equal to the inductance of the load 12.

Once the duration T/2 has expired, the gating signals are removed from the FETs 14, 16 for a duration T/2. When this occurs, the FETs stop conducting going through the same sequence of transitional steps previously described with respect to FET turn on but in the reverse order. This operation of the FETs 14, 16 isolates the inductive load 12 from the power supply 18. As this happens, the inductive load 12 generates a voltage across its terminals in an attempt to maintain the current I through itself. Once the voltage is generated by the load 12, the diodes 20, 22 are forward biased by the voltage and conduct allowing current to flow from the negative terminal 18− to the positive terminal 18− of the power supply. As the diodes 20, 22 switch on and conduct current, the stray capacitance $C_s$ is effectively removed from the legs of the bridge switch 10 so that energy exchange with the stray inductance $L_s$ is minimal. This current through the inductive load 12 decreases by delta I, the same value as above and the process is repeated. If it is desired to increase the current through the load 12, the duty cycle is manipulated appropriately until the desired current level is reached. Once this occurs, the duty cycle is returned to a 50% value so that the FETs 14, 16 remain on and off for equal periods of time. Under this condition, a steady state unidirectional current flows through the inductive load 12 with a small ripple.

After the off duration T/2 has expired, the gating signals are re-applied to the FETs 14, 16 causing them to turn on following the sequence of transitional steps previously described. Once the gating signals have been re-applied to the FETs, it is desired to have the diodes effectively removed from the switch 10 and establish an open circuit in the legs of the bridge switch 10. However, once the diodes 20, 22 have conducted during the FET off condition, they hold a residual charge and cannot stop conducting until the charge has been dissipated. During the charge dissipation, the diodes form an effective short circuit. Since the FETs 14 and 16, at the time the diodes form a short circuit, are capable of conducting current due to the application of gating signals, two current paths are formed from the positive terminal 18+ to the negative terminal 18− of the power supply. The first current path is constituted by FET 14 and diode 20 while the other current path is constituted by diode 22 and FET 16. This of course allows a large reverse recovery current to flow through the FETs 14 and 16 respectively. As the charge is removed from the diodes 20, 22, the reverse recovery current through the diodes falls rapidly to zero.

In view of the operation of the diodes 20,22 during FET turn on and the delay in the FETs reaching their final fully on condition, problems exist in the operation of the switch 10. In particular, during FET turn on, the FETs 14, 16 are capable of carrying their full rated current within less than 100 ns while the diodes 20, 22 begin to turn off. At this time, the drain voltage of the FETs is still high and within 50 ns after the load current has been taken by the FETs, the reverse recovery current through the diodes 20, 22 collapses due to the removal of the residual charge. When this occurs, the energy stored in the stray inductance $L_s$ due to reverse recovery current flow therethrough is exchanged with the stray capacitance $C_s$ in an oscillatory fashion with a typical frequency in the order of between 60 to 150 Mhz. Due to the minimum damping in the switch 10, large oscillations are present at the drain of the FETs 14 and 16 which are coupled to their gate via the gate to drain capacitance $C_{gd}$. This results in increased power dissipation in the FETs due to drain current modulation and also results in large gate voltage swings which can destroy the FETs 14 and 16 and hence, the bridge switch 10.

In view of the operation of the bridge switch 10 in this manner, it is desired to remove any stray inductance and stray capacitance in the switch so that resonant circuits are not formed therein. However, this is not possible and although the switch 10 can be designed to reduce these stray values, the problems associated with the large reverse recovery current still exist causing excessive power loss in the switch.

Figure 2:
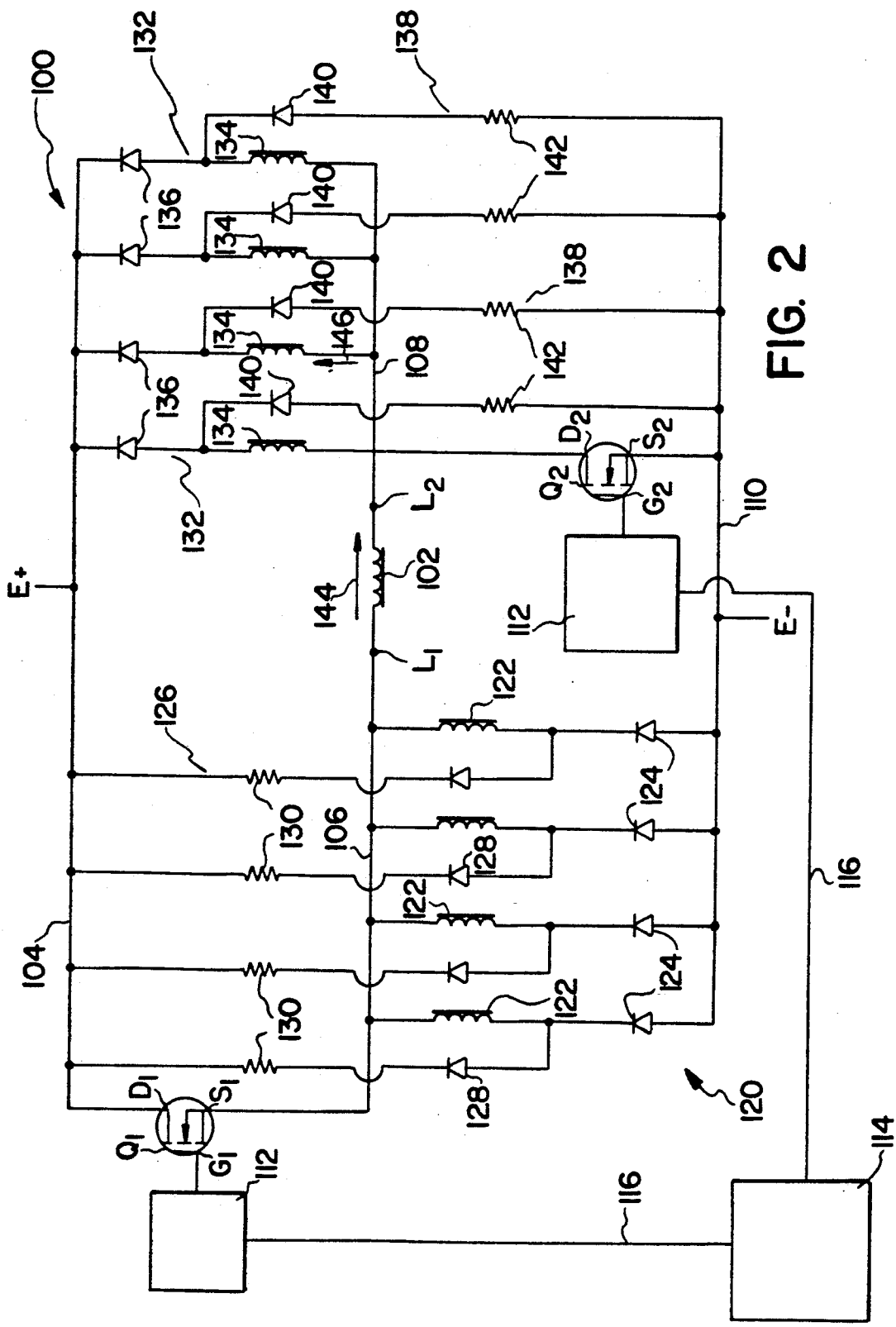
FIG. 2 is a schematic drawing of the present switch.

To overcome the problems associated with the conventional switch 10, the present switch shown in FIG. 2 is provided and is generally indicated by reference numeral 100. The switch 100 includes a pair of field effect transistors (FETs) $Q_1$ and $Q_2$ located on opposite sides and connected in series with an inductive load 102 such as a magnetic bearing. As can be seen, FET $Q_1$ has its drain terminal $D_1$ connected to a positive source conductor 104. The source terminal $S_1$ of the FET $Q_1$ is connected to a conductor 106 which extends to one terminal L of the inductive load 102.

A conductor 108 extends from the other terminal $L_2$ of the inductive load 102 and is connected to the drain terminal $D_2$ of FET $Q_2$. The source terminal $S_2$ of the FET $Q_2$ is connected to a negative source conductor 110. The gate terminals $G_1$ and $G_2$ of the FETs $Q_1$ and $Q_2$ respectively are connected to a gate driver 112, each driver of which receives gate driving signals from a controller 114 via a fibre optic cable 116.

A plurality of parallel current paths 120 extend between the conductor 106 and the negative source conductor 110. Each current path 120 includes an inductor 122 and a free-wheeling diode 124 connected in series. The diodes 124 and inductors 122 are arranged so that the anode of each diode 124 is connected to conductor 110 and the cathode of each diode is connected to one terminal of the inductor 122. The other terminal of the inductors 122 are connected to conductor 106. A choke energy path 126 is associated with each current path 120 and includes a diode 128 connected in series with a resistor 130. The diode 128 and resistor 130 in each choke energy path are arranged so that the anode of the diode is connected to its associated current path 120 at the junction of the inductor 122 and the diode 124. The cathode of each diode 128 is connected to one terminal of the resistor 130 while the other terminal of the resistors 130 are connected to conductor 104.

Similarly, a plurality of current paths 132 extend between the conductor 108 and the positive source conductor 104. Each of the current paths 132 also includes an inductor 134 connected in series with a free-wheeling diode 136. The diodes 136 and inductors 134 are arranged so that the anode of each diode 136 is connected to one terminal of the inductor 134 and the cathode of each diode is connected to conductor 104. The other terminal of the inductors 134 are connected to conductor 108. A choke energy path 138 is associated with each of the current paths 132 and includes a diode 140 connected in series with a resistor 142. The diode 140 and resistor 142 in each choke energy path 138 are arranged so that the cathode of the diode 140 is connected to its associated current path 132 at the junction of the inductor 134 and the diode 136. The anode of each diode 140 is connected to one terminal of the resistor 142 while the other terminal of the resistor 142 is connected to conductor 110. Although not shown, it should be apparent that stray inductance and stray capacitance illustrated in the prior art switch still exist in each leg of the switch 100 due to the diodes 124, 136 and wiring.

The positive or high potential terminal $E^+$ of a power supply E is connected to the positive source conductor 104 while the negative or low potential terminal $E^-$ of the power supply E is connected to the negative source conductor 110 via power supply bars (not shown). This permits current flow through the inductive load 102 when the FETs $Q_1$ and $Q_2$ are gated as will be described. Since the power supply is typically located remote from the switch 100 in most applications, cables (not shown) are used to connect the conductors 104 and 108 to the power supply E. To handle the majority of the large ripple current occurring due to the reversal of the full load current in the switch 100 every half cycle, a large capacitor (not shown) is connected to the power supply bar feeding the conductor 104. In addition, three low equivalent series resistance (ESR) and low equivalent series inductance (ESL) capacitors (not shown) are distributed along the power supply bar. The large and small capacitors prevent excessive ripple current on the conductor 104 and isolate the cables extending from the switch 100 in a manner so that the inductance of the cable does not contribute to stray resonant circuits formed in the switch 100.

The operation of the switch 100 will now be described assuming that the switch 100 is initially idle. When it is desired to energize the inductive load 102, the controller 114 generates gate driving commands for both FETs $Q_1$ and $Q_2$ which are conveyed to the drivers 112 via the optical fibers 116. The gate drivers 112 in turn supply gating signals to their respective FETs so that the FETs $Q_1$ and $Q_2$ become operational at substantially the same time following the sequence of transitional steps described previously for FETs 14 and 16. The gating signals are supplied to each FET for a duration T/2 assuming that the switch is operated at a 50% duty cycle.

Once the FETs $Q_1$ and $Q_2$ reach their fully on condition, the FETs provide a closed circuit between their respective drain and source terminals thereby connecting the inductive load 102 between the positive and negative terminals of the power supply E via the conductors 104, 106, 108 and 110. This of course permits current to flow between the power supply terminals in the direction of arrow 144 thereby energizing the inductive load. After the duration T/2 has expired and it is desired to open the switch 100 to isolate the inductive load from the power supply E for a duration T/2, the controller 114 removes the gate driving commands. This of course causes the gate bias applied to the gate terminals of the FETs $Q_1$ and $Q_2$ by the drivers 112 to be removed. Once the gate bias has been removed, the FETs $Q_1$ and $Q_2$ cease conducting and establish an open circuit between their respective source and drain terminals in the manner previously described for FETs 14 and 16.

Once the FETs $Q_1$ and $Q_2$ isolate the inductive load 102 from the power supply E, the inductive load generates a voltage across its terminals to attempt to maintain the current through itself. Once the voltage is generated by the inductive load, the diodes 124, 136 in each of the two sets of current paths 120, 132 respectively conduct so that current is applied back to the positive terminal $E^+$. The current applied back to the power supply E decreases in the manner previously described with respect to the conventional switch.

When the duration T/2 has elapsed and the FETs $Q_1$, $Q_2$ are operated again to re-energize the inductive load 102, it is desired that the diodes 124, 136 cease conducting immediately and that the FETs $Q_1$ and $Q_2$ establish their fully on condition instantaneously. However, when the FETS $Q_1$ and $Q_2$ are gated again via the drivers 112, the FETs establish a closed circuit across their respective drain and source terminals but experience the delay between reaching their fully on condition with a low drain voltage while carrying their full rated current due to their turn on sequence. In addition, the diodes 124, 136 hold a residual charge which must be removed before they stop conducting.

In light of this delay and the operation of the diodes, it is important to limit large gate voltage swings and large reverse recovery current flowing between the power supply terminals E+ and E− respectively via the FET $Q_1$ and diodes 124 and the diodes 136 and FET $Q_2$ during the delay since these conditions may damage or destroy the FETs $Q_1$ and $Q_2$ and hence the switch 100 as previously described.

To reduce reverse recovery current through the diodes 124, 136 during the delay while the charge is being removed from the diodes, the inductors 122, 134 are provided in the current paths 132. When the current flows through the current paths 120, 132 to allow the current flow through the inductive load 102 to be maintained during the FET off condition, a current is established in each of the inductors 134 in the direction of arrow 146. During removal of the charge from the diodes 124, 136 and the subsequent reverse recovery currents being established through them, the inductors 134 function to generate a voltage across its terminals in an attempt to maintain the current through themselves in the direction of arrow 146. This initial voltage generated by the inductors 134 inhibits the reverse recovery current flow through the current paths. By selecting inductors of appropriate values, the reverse recovery current peak can be delayed until the FETs Q and $Q_2$ are substantially in their fully on condition. In addition, each inductor 122, 134 limits the rate of change of current through the diodes 124, 136 and thus, the peak reverse recovery current through each diode 124, 136 is reduced. This decreases power dissipation in the FETs $Q_1$ and $Q_2$ and hence the switch 100. Furthermore, since the peak reverse recovery current flow in the switch 100 is delayed until the FETs Q and $Q_2$ are fully on, the effect of oscillations on the gates of the FETs is greatly diminished. In addition, the provision of the multiple current paths connected in parallel reduces further the stray inductance in the switch 100 and thus, reduces oscillation energy in the switch resulting due to strays.

To dissipate the energy stored in the inductors 122, 134 due to the reverse recovery currents and the oscillation energy associated with the resonant circuit formed in each current path due to the stray capacitance and stray inductance of the diodes 124, 136 and the inductors 122, 134, the choke energy paths 126, 138 are provided. The choke energy paths conveniently dump the energy stored in the inductors 122, 134 into the resistors 130, 142 via the fast low capacitance diodes 128, 140 respectively. In addition, the choke energy paths function as resistive dampers which minimize oscillations occurring in the resonant circuits formed due to strays.

Although the drain voltage at FET $Q_2$ rises above the voltage of the power supply E due to the high rate of change of current through the FET $Q_2$ at FET turn off, this voltage overshoot can be limited by choosing the appropriate value of the inductors 122, 134 which still delay the reverse recovery current through the diodes 124, 136 until the FETs $Q_1$ and $Q_2$ reach their fully on condition.

The present switch has been found to be capable of handling currents in excess of 50 amps through an inductive load in the form of a magnetic bearing while connected to a 160 volt power supply E and while operating at a switching rate of 40 kHz yet only requiring an inexpensive air cooling system.

As should be apparent, the present switch provides advantages in that since the reverse recovery currents in the switch are inhibited and since the peak reverse recovery current is delayed until the FETs reach a fully on condition, power dissipation in the switch is reduced. This permits the switch to be operated at switching rates exceeding conventional switching rates while only requiring an air cooling system. Moreover, since the multiple current drains reduce stray inductance and peak reverse currents, oscillation energy in the switch is reduced.

Although two single FETs $Q_1$ and $Q_2$ are shown with each FET being located in one leg of the bridge switch 100, it should be realized that a plurality of FETs arranged in parallel with their drain terminals interconnected to form a single input terminal and with their source terminals interconnected to form a single output terminal may be used. This parallel arrangement of FETs is particularly suitable in high power applications. In the case where two sets of parallel FETs are used, the drivers 112 supply gating signals to each FET in the set.

Although the present switch has been described as using FETs, it should be apparent to those of skill in the art that other semiconductor switches such as bipolar junction transistors (BJTs) and the like may be used.

It should also be apparent to those of skill in the art that modifications and variations may be made to the present invention without departing from the scope thereof as defined by the appended claims.

We claim:
1. A switch for an inductive load having first and second terminals, said switch comprising:
   first semiconductor switch means for connection between said first terminal and a high potential terminal of a power supply;
   second semiconductor switch means for connection to said second terminal and a low potential terminal of said power supply, said first and second switch means and said inductive load forming a series circuit with said first and second switch means being responsive to control signals to connect and disconnect said first and second terminals to said high potential and low potential terminals respectively;
   a plurality of first current paths including a first rectifying element and extending from said second terminal to said high potential terminal;
   a plurality of second current paths including a second rectifying element and extending from said first terminal to said low potential terminal wherein said first current paths and said second current paths are connected in parallel; and
   means provided in each of said first current paths and said second current paths and being connected between said inductive load and said rectifying element for inhibiting reverse recovery current through said respective first and second rectifying elements upon operation of said first and second switch means to disconnect said inductive load from said power supply and for dissipating energy in said switch occurring as a result of said reverse recovery current, wherein said means for inhibiting reverse recovery current and for dissipating energy in each of said first current paths and said second current paths includes an inductor having one terminal thereof connected to said inductive load and another terminal thereof connected to said rectifying element.

2. A switch as defined in claim 1 wherein said means for inhibiting reverse recovery current and for dissipating energy in each of said first and second current paths further includes a choke energy path in the form of a third rectifying element connected in series with a resistive element, said choke energy path having one terminal connected between said inductor and said rectifying element and a second terminal connected to the terminal of said power supply opposite to that which said current path extends.

3. A switch as defined in claim 1 wherein said first, second and third rectifying elements are in the form of diodes.

4. A switch as defined in claim 1 wherein said first and second rectifying elements are in the form of first and second diodes respectively.

5. A switch as defined in claim 1 wherein said third rectifying elements are in the form of low capacitance diodes, said choke energy paths functioning to dissipate energy stored in said inductors and to dampen oscillations in said switch.

6. A switch as defined in claim 5 wherein said first and second switch means each include at least one field effect transistor.

7. A switch as defined in claim 4 wherein said first and second semiconductor switch means each include at least one field effect transistor, said means for inhibiting reverse recovery current and for dissipating energy in each of said first and second current paths including an inductor having one terminal thereof connected to said inductive load and another terminal thereof connected to said diode, said inductors inhibiting reverse recovery current through said diodes during operation of said transistors in response to said control signals to connect said load to said power supply for a time period sufficient for said field effect transistors to establish a fully on condition.

8. A switch as defined in claim 7 wherein said means for inhibiting reverse recovery current and for dissipating energy in each of said first and second current paths further includes a choke energy path in the form of a third diode connected in series with a resistor, said choke energy path having one terminal connected between said inductor and said first and second diode respectively and a second terminal connected to the terminal of said power supply opposite to that which said current path extends.

9. A switch as defined in claim 8 wherein said control signals are applied to said field effect transistors in a manner to condition said transistors to connect and disconnect said load to said power supply at a rate in excess of 40 kHz.

10. An inductive circuit comprising:
a power supply having a high potential terminal and a low potential terminal;
an inductive load; and
a switch operable to connect and disconnect said inductive load between said high potential and low potential terminals, said switch including:
first semiconductor switch means connected between said first terminal and a high potential terminal of a power supply;
second semiconductor switch means connected to said second terminal and a low potential terminal of said power supply, said first and second switch means and said inductive load forming a series circuit with said first and second switch means being responsive to control signals to connect and disconnect said first and second terminals to said high potential and low potential terminals respectively;
a plurality of first current paths including a first rectifying element and extending from said second terminal to said high potential terminal;
a plurality of second current paths including a second rectifying element and extending from said first terminal to said low potential terminal, wherein said first current paths and said second current paths are connected in parallel; and
means provided in said first and second current path and being connected between said inductive load and said rectifying element for inhibiting reverse recovery current through said respective first and second rectifying elements upon operation of said first and second switch means to disconnect said inductive load from said power supply and for dissipating energy in said switch occurring as a result of said reverse recovery current, wherein said means for inhibiting reverse recovery current and for dissipating energy in each of said first current paths and said second current paths includes an inductor having one terminal thereof connected to said inductive load and another terminal thereof connected to said rectifying element.

11. A circuit as defined in claim 10 wherein said means for inhibiting reverse recovery current and for dissipating energy in each of said first and second current paths further includes a choke energy path in the form of third rectifying element connected in series with a resistive element, said choke energy path having one terminal connected between said inductor and said rectifying element and a second terminal connected to the terminal of said power supply opposite to that which said current path extends.

12. A circuit as defined in claim 10 wherein said inductive load is in the form of a magnetic bearing.

13. A circuit as defined in claim 12 wherein said control signals are applied to said field effect transistors in a manner to condition said transistors to connect and disconnect said load to said power supply at a rate in excess of 40 kHz.

14. A circuit as defined in claim 10 wherein said control signals are applied to said field effect transistors in a manner to condition said transistors to connect and disconnect said load to said power supply at a rate in excess of 40 kHz.

* * * * *